(12) United States Patent
Jang et al.

(10) Patent No.: US 12,094,426 B2
(45) Date of Patent: Sep. 17, 2024

(54) LIGHT EMITTING DIODE MODULE AND DISPLAY APPARATUS HAVING THE SAME

(71) Applicant: SAMSUNG ELECTRONICS CO., LTD., Suwon-si (KR)

(72) Inventors: Hyukjun Jang, Suwon-si (KR); Sungyeol Kim, Suwon-si (KR); Hyungsuk Kim, Suwon-si (KR); Kyungsoo Park, Suwon-si (KR); Youngmin Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/941,742

(22) Filed: Sep. 9, 2022

(65) Prior Publication Data

US 2023/0075434 A1    Mar. 9, 2023

Related U.S. Application Data

(63) Continuation of application No. PCT/KR2022/009333, filed on Jun. 29, 2022.

(30) Foreign Application Priority Data

Aug. 31, 2021 (KR) .................. 10-2021-0115902

(51) Int. Cl.
   *G09G 3/34* (2006.01)
   *G09G 3/32* (2016.01)
(52) U.S. Cl.
   CPC ............. *G09G 3/3406* (2013.01); *G09G 3/32* (2013.01); *G09G 2330/06* (2013.01)

(58) Field of Classification Search
   CPC .......... G09G 3/32–3291; G09G 3/3406–3426; G09G 2330/06
   See application file for complete search history.

(56) References Cited

U.S. PATENT DOCUMENTS

| | | |
|---|---|---|
| 8,159,000 B2 | 4/2012 | Lee et al. |
| 8,403,532 B2 | 3/2013 | Yamashita et al. |
| 8,967,822 B2 | 3/2015 | Hong et al. |
| 9,295,854 B2 * | 3/2016 | Mersch ............... A61N 5/0613 |
| 9,539,824 B2 * | 1/2017 | Masuda ............... H05B 45/00 |

(Continued)

FOREIGN PATENT DOCUMENTS

| | | |
|---|---|---|
| JP | 2002-325429 A | 11/2002 |
| JP | 2005-174820 A * | 6/2005 |

(Continued)

OTHER PUBLICATIONS

International Search Report dated Oct. 28, 2022, issued by the International Searching Authority in International Application No. PCT/KR2022/009333 (PCT/ISA/210).

(Continued)

*Primary Examiner* — Gene W Lee
(74) *Attorney, Agent, or Firm* — Sughrue Mion, PLLC

(57) ABSTRACT

A light emitting diode (LED) includes a substrate having a bar shape; a plurality of LEDs provided on the substrate; and a wiring pattern provided on the substrate and configured to transmit driving currents to the plurality of LEDs, wherein the wiring pattern has a shape that is bent multiple times so that the driving currents flow in opposite directions in lines aligned adjacent and parallel to each other.

15 Claims, 21 Drawing Sheets

(56) References Cited

U.S. PATENT DOCUMENTS 10,863,616 B1   12/2020   Park
10,957,675 B2    3/2021   Park et al.

FOREIGN PATENT DOCUMENTS

| | | |
|---|---|---|
| JP | 4113832 B2 * | 7/2008 |
| JP | 2017-103488 A | 6/2017 |
| KR | 10-2006-0098229 A | 9/2006 |
| KR | 10-1157852 B1 | 6/2012 |
| KR | 10-1237788 B1 | 2/2013 |
| KR | 10-2019-0053720 A | 5/2019 |
| KR | 10-2164488 B1 | 10/2020 |
| KR | 10-2021-0075667 A | 6/2021 |

OTHER PUBLICATIONS

Written Opinion dated Oct. 28, 2022, issued by the International Searching Authority in International Application No. PCT/KR2022/009333 (PCT/ISA/237).

* cited by examiner

LIGHT EMITTING DIODE MODULE AND DISPLAY APPARATUS HAVING THE SAME

CROSS-REFERENCE TO RELATED APPLICATIONS

This application is a continuation application of International Application No. PCT/KR2022/009333, filed on Jun. 29, 2022, which is based on and claims priority to Korean Patent Application No. 10-2021-0115902, filed on Aug. 31, 2021, in the Korean Intellectual Property Office, the disclosure of which is incorporated herein by reference in its entirety.

BACKGROUND

1. Field

The disclosure relates to a light emitting diode module in which a plurality of light emitting diodes are arranged and a display apparatus including the same.

2. Description of Related Art

A display apparatus may include televisions (TVs), monitors, various portable terminals (e.g., laptop computers, tablet PCs, and smartphones), or any output device that can visually display data information such as text, figures, or images.

Display apparatuses may be classified into self-emissive display apparatuses using a self-emissive display panel such as an organic light emitting diode (OLED) and non-self-emissive display apparatuses using a display panel receiving light from a backlight unit such as a liquid crystal display (LCD).

Backlight units may be classified, according to the position of a light source, into a direct type in which a light source is arranged behind a display panel and an edge type in which a light source is arranged at an edge of a display panel.

A direct type backlight unit may include a light source module in which a plurality of light emitting diodes (LEDs) are mounted on a printed circuit board.

SUMMARY

Provided are a bar-type light emitting diode (LED) module capable of reducing noise, which is caused by generation of a magnetic field, by forming a wiring pattern in a shape bent multiple times such that driving currents flow in opposite directions in adjacent lines and a display apparatus including the same.

According to an aspect of the disclosure, a light emitting diode (LED) module includes: a substrate having a bar shape; a plurality of LEDs provided on the substrate; and a wiring pattern provided on the substrate and configured to transmit driving currents to the plurality of LEDs, wherein the wiring pattern has a shape that is bent multiple times so that the driving currents flow in opposite directions in lines aligned adjacent and parallel to each other.

The plurality of LEDs may be connected in series by the wiring pattern, and the wiring pattern may include a plurality of connection wires respectively connecting two adjacent LEDs among the plurality of LEDs connected in series.

Each of the plurality of connection wires may have a shape that is bent at least twice.

Each of the plurality of connection wires may have a shape that is bent 90° at least twice.

The wiring pattern may include a plurality of partial lines that are defined by the bending and have a linear shape.

Currents may flow in opposite directions in two partial lines aligned adjacent and parallel to each other among the plurality of partial lines.

A distance between the two partial lines may be less than a first reference value.

A length of a partial line perpendicular to the two partial lines, among the plurality of partial lines, may be less than a second reference value.

A first end of the wiring pattern may be connected to an anode terminal to which a driving voltage is applied and a second end of the wiring pattern may be connected to a cathode terminal to which a ground voltage is applied, and the first and second ends of the wiring pattern may be located at a same side of the wiring pattern.

The wiring pattern may include a linear partial line connecting a cathode of a last LED in a direction where a driving current flows among the plurality of LEDs connected in series to the cathode terminal, and a distance between the partial line perpendicular to the two partial lines and the linear partial line may be less than the first reference value.

According to an aspect of the disclosure, a display apparatus includes: a bottom chassis; a plurality of light emitting diode (LED) modules provided on the bottom chassis; a liquid crystal panel provided in front of the plurality of LED modules; and an LED driver configured to control driving currents supplied to the plurality of LED modules, wherein each of the plurality of LED modules includes: a substrate having a bar shape; a plurality of LEDs provided on the substrate; and a wiring pattern provided on the substrate and configured to transmit the driving currents to the plurality of LEDs, and wherein the wiring pattern has a shape that is bent multiple times so that the driving currents flow in opposite directions in lines aligned adjacent and parallel to each other.

The plurality of LEDs may be connected in series by the wiring pattern, and the wiring pattern may include a plurality of connection wires respectively connecting two adjacent LEDs among the plurality of LEDs connected in series.

Each of the plurality of connection wires may have a shape that is bent at least twice.

Each of the plurality of connection wires may have a shape that is bent 90° at least twice.

The wiring pattern may include a plurality of partial lines that are defined by the bending and have a linear shape, and currents may flow in opposite directions in two partial lines aligned adjacent and parallel to each other among the plurality of partial lines.

According to an aspect of the present disclosure, noise caused by generation of a magnetic field may be reduced by forming a wiring pattern in a shape bent multiple times such that driving currents flow in opposite directions in adjacent lines.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
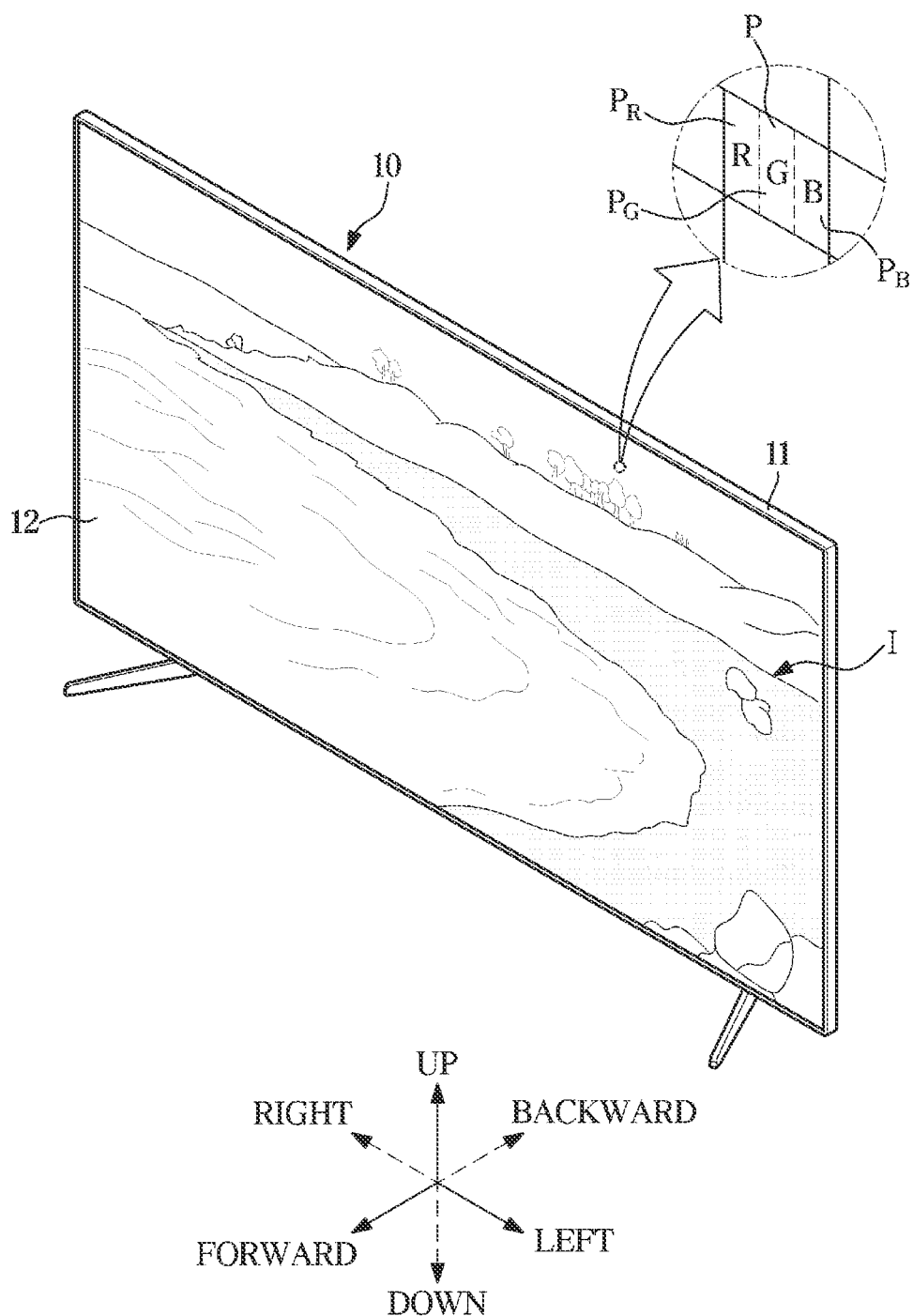
FIG. 1 is a perspective view illustrating an example appearance of a display apparatus according to an embodiment.

Throughout the specification, like reference numerals refer to like elements throughout. This specification does not describe all elements of the embodiments of the present disclosure and detailed descriptions on what are well known in the art or redundant descriptions on substantially the same configurations may be omitted. The terms 'unit, module, member, and block' used herein may be implemented using a software or hardware component. According to an embodiment, a plurality of 'units, modules, members, and blocks' may also be implemented using an element and one 'unit, module, member, and block' may include a plurality of elements.

Throughout the specification, when an element is referred to as being "connected to" another element, it may be directly or indirectly connected to the other element and the "indirectly connected to" includes connected to the other element via a wireless communication network, wiring, or soldering.

Also, it is to be understood that the terms "include" or "have" are intended to indicate the existence of elements disclosed in the specification, and are not intended to preclude the possibility that one or more other elements may exist or may be added.

Throughout the specification, it will be understood that when one element, is referred to as being "on" another element, it can be directly on the other element, or intervening elements may also be present there between.

Throughout the specification, when one element transmits or sends a signal or data to another element, it is not intended to preclude the possibility that a third element exists between the elements and the signal or data is transmitted or sent via the third element, unless otherwise stated.

Throughout the specification, terms "first", "second", and the like are used to distinguish one component from another, without indicating alignment order, manufacturing order, or importance of the components.

An expression used in the singular encompasses the expression of the plural, unless otherwise indicated.

The reference numerals used in operations are used for descriptive convenience and are not intended to describe the order of operations and the operations may be performed in a different order unless the order of operations are clearly stated.

Hereinafter, embodiments of the present disclosure will be described in detail with reference to the accompanying drawings.

FIG. 1 is a perspective view illustrating an example appearance of a display apparatus according to an embodiment.

A display apparatus 10 is an apparatus that processes an image signal received from the outside and visually displays a processed image. Although a television (TV) is exemplarily described as the display apparatus 10 below, embodiments of the present disclosure are not limited thereto.

For example, the display apparatus 10 may be implemented using various types such as a monitor, a portable multimedia apparatus, and a portable communication apparatus. Any apparatus that visually displays an image may also be used as the display apparatus 10 and types thereof are not limited.

In addition, the display apparatus 10 may be a large format display (LFD) installed outdoors, such as a rooftop of a building or a bus stop. In this regard, the outdoors are not necessarily limited to open space outside a building, and the display apparatus 10 may also be installed in any places, even indoors, as long as a large number of people visit the places such as a subway station, a shopping mall, a movie theater, a company, and a retail store.

The display apparatus 10 may receive contents including video signals and audio signals from various content sources and output videos and audios corresponding to the video signals and audio signals. For example, the display apparatus 10 may receive content data via a broadcast-receiving antenna or a cable, receive content data from a content reproduction device, or receive content data from a content-providing server of a content provider.

As shown in FIG. 1, the display apparatus 10 may include a main body 11 and a screen 12 to display an image I.

The main body 11 defines an appearance of the display apparatus 10 and may include components used to display the image I or perform various functions of the display apparatus 10. Although the main body 11 illustrated in FIG. 1 has a flat panel shape, the shape of the main body 11 is not limited to the flat panel shape shown in FIG. 1. For example, the main body 11 may have a curved shape.

The screen 12 is disposed on the front surface of the main body 11 and may display the image I. For example, the screen 12 may display a still image or a moving image. Also, the screen 12 may display a two-dimensional planar image or a three-dimensional image using binocular disparity of a user.

The image I displayed on the screen 12 may be formed by light emitted from a plurality of pixels P. For example, light respectively emitted from the plurality of pixels P are combined to form the image I on the screen 12.

The plurality of pixels P may emit light with various luminance and different colors. Each of the plurality of pixels P include sub-pixels $P_R$, $P_G$, and $P_B$ to emit light of different colors.

The sub-pixels $P_R$, $P_G$, and $P_B$ may include a red sub-pixel $P_R$ configured to emit red light, a green sub-pixel $P_G$ configured to emit green light, and a blue sub-pixel $P_B$ configured to emit blue light.

For example, red light refers to light having a wavelength of about 620 nm to about 750 nm, green light refers to light having a wavelength of about 495 nm to about 570 nm, and blue light refers to light having a wavelength of about 450 nm to about 495 nm.

By varying the red light of the red sub-pixel $P_R$, the green light of the green sub-pixel $P_G$, and the blue light of the blue sub-pixel $P_B$, each of the plurality of pixels P may emit light of various luminance and different colors.

The display apparatus 10 according to an embodiment is a non-self-emissive display apparatus in which light is supplied by a backlight unit. Hereinafter, a liquid crystal display including a liquid crystal panel and a backlight unit will be descried as an example of the display apparatus 10.

Figure 2:
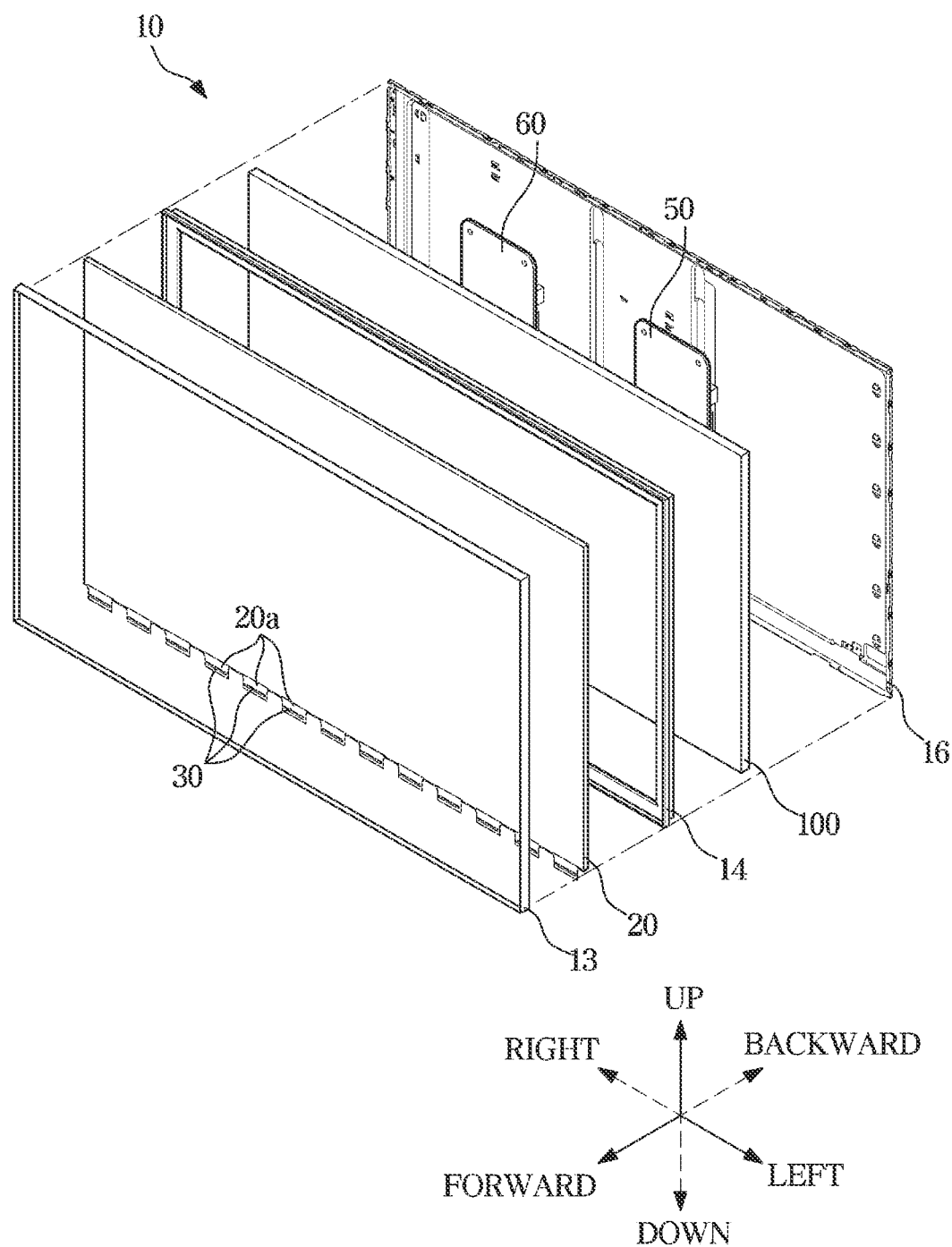
FIG. 2 is an exploded perspective view illustrating an example structure of a display apparatus according to an embodiment.
Figure 3:
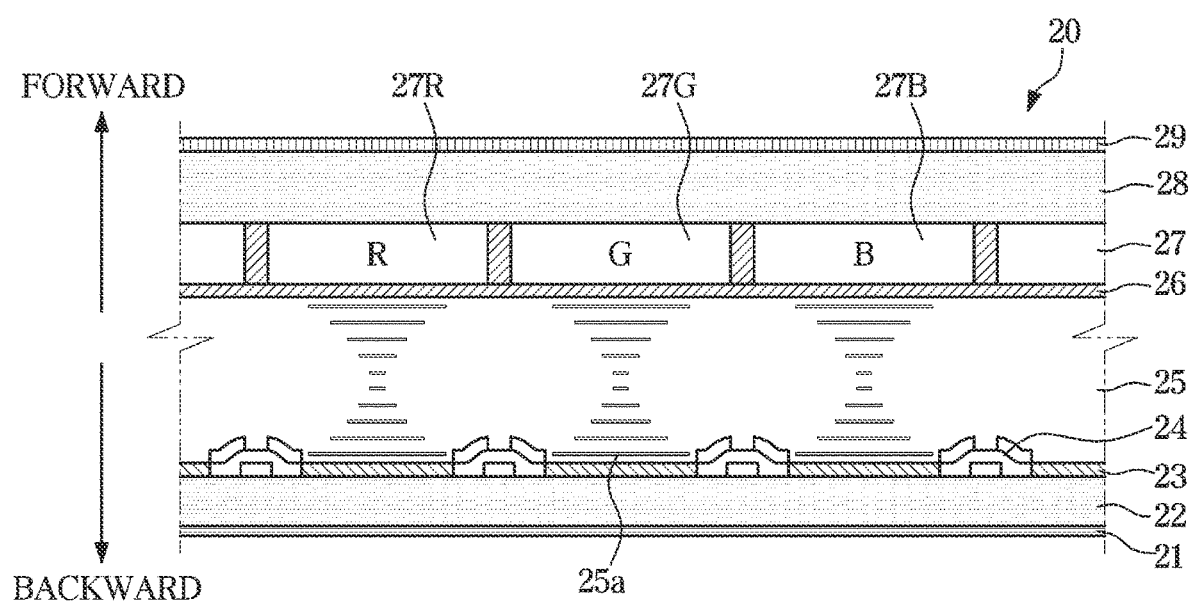
FIG. 3 is a side cross-sectional view illustrating an example of a liquid crystal panel included in a display apparatus according to an embodiment.

FIG. 2 is an exploded perspective view illustrating an example structure of a display apparatus according to an embodiment. FIG. 3 is a side cross-sectional view illustrating an example of a liquid crystal panel included in a display apparatus according to an embodiment.

As shown in FIG. 2, various components for generating an image I displayed on the screen 12 may be provided inside the main body 11.

For example, the main body 11 may include a backlight unit 100 as a surface light source, a liquid crystal panel 20 configured to block or transmit light emitted from the backlight unit 100, a control board 50 configured to control the operation of the backlight unit 100 and liquid crystal panel 20, and a power board 60 configured to supply power to the backlight unit 100 and liquid crystal panel 20.

The main body 11 may include a bezel 13, a frame middle mold 14, and a rear cover 16 to support the liquid crystal panel 20, the backlight unit 100, the control board 50, and the power board 60.

The backlight unit 100 may include a point light source configured to emit monochromatic light or white light. Also, the backlight unit 100 may refract, reflect, and scatter light emitted from the point light source to convert the light into uniform surface light. In this way, the backlight unit 100 may emit uniform surface light forward by refracting, reflecting, and scattering light emitted from the point light source. The backlight unit 100 will be described below in more detail.

The liquid crystal panel 20 may be provided in front of the backlight unit 100 and may block or transmit light emitted from the backlight unit 100 to generate an image I.

The front surface of the liquid crystal panel 20 constitutes the screen 12 of the display apparatus 10 described above, and the liquid crystal panel 20 may form a plurality of pixels P. The plurality of pixels P of the liquid crystal panel 20 may each independently block or transmit light received from the backlight unit 100, and the light passing through the plurality of pixels P may form an image I to be displayed on the screen 12. The plurality of pixels P may be arranged in a two-dimensional matrix form.

Referring to FIG. 3, the liquid crystal panel 20 may include a first polarizing film 21, a first transparent substrate 22, a pixel electrode 23, a thin film transistor 24, a liquid crystal layer 25, a common electrode 26, a color filter 27, a second transparent substrate 28, and a second polarizing film 29.

The first transparent substrate 22 and the second transparent substrate 28 may fixedly support the pixel electrode 23, the thin film transistor 24, the liquid crystal layer 25, the common electrode 26, and the color filter 27. The first and second transparent substrates 22 and 28 may be formed of tempered glass or transparent resin.

The first polarizing film 21 and the second polarizing film 29 may be disposed on external surfaces of the first transparent substrate 22 and the second transparent substrate 28, respectively. Each of the first polarizing film 21 and the second polarizing film 29 may transmit light of a specific polarization while blocking light of other polarizations.

For example, the first polarizing film 21 may transmit light polarized in a first direction and block light polarized in the other directions. In addition, the second polarizing film 29 may transmit light polarized in a second direction and block light polarized in the other directions. In this case, the first direction may be perpendicular to the second direction. Therefore, the polarized light passing through the first polarizing film 21 cannot pass through the second polarizing film 29.

The color filter 27 may be provided inside the second transparent substrate 28. The color filter 27 may include a red filter 27R transmitting red light, a green filter 27G transmitting green light, and a blue filter 27B transmitting blue light. The red filter 27R, the green filter 27G, and the blue filter 27B may be aligned parallel to each other.

A region where the color filter 27 is formed may correspond to the pixel P described above. A region where the red filter 27R is formed may correspond to the red sub-pixel $P_R$, a region where the green filter 27G is formed may correspond to the green sub-pixel $P_G$, and a region where the blue filter 27B is formed may correspond to the blue sub-pixel $P_B$.

The pixel electrode 23 may be provided at the inner surface of the first transparent substrate 22, and the common electrode 26 may be provided at the inner surface of the second transparent substrate 28. The pixel electrode 23 and the common electrode 26 may be formed of electrically conductive metallic materials and generate an electric field to change alignment of liquid crystal molecules 25a constituting the liquid crystal layer 25.

The thin film transistor (TFT) 24 may be provided at an inner surface of the first transparent substrate 22. The TFT 24 may transmit or block current flowing in the pixel electrode 23. For example, an electric field may be formed or eliminated between the pixel electrode 23 and the common electrode 26 by turning on (close) or off (open) the TFT 24.

The liquid crystal layer 25 is formed between the pixel electrode 23 and the common electrode 26 and filled with the liquid crystal molecules 25a. Liquid crystals exhibit a state between that of a solid (crystals) and that of a liquid. Liquid crystals may also have optical properties changing in accordance with an electric field. For example, an alignment direction of liquid crystal molecules constituting the liquid crystal layer may be changed in accordance with a change in the electric field. Optical properties of the liquid crystal layer 25 may vary according to the presence or absence of the electric field passing through the liquid crystal layer 25.

Referring back to FIG. 2, a cable 20a to transmit image data to the liquid crystal panel 20 and a display driver integrated circuit (DDI) 30 (hereinafter, referred to as 'panel driver') configured to process digital image data and output analogue image signals may be provided at one side of the liquid crystal panel 20.

The cable 20a may electrically connect the panel driver 30 with the control board 50 and the power board 60. In addition, the cable 20a may electrically connect the panel driver 30 with the liquid crystal panel 20. The cable 20a may be a flexible flat cable and/or a film cable.

The panel driver 30 may receive image data from the control board 50 and power from the power board 60 via the cable 20a. In addition, the panel driver 30 may provide image data and driving current to the liquid crystal panel 20 through the cable 20a.

The cable 20a and the panel driver 30 may be provided integrally. For example, the cable 20a and the panel driver 30 may be implemented as a chip on film (COF) or a tape carrier packet (TCP). In other words, the panel driver 30 may be located on the cable 20a. However, the embodiment is not limited thereto, and the panel driver 30 may also be located at the liquid crystal panel 20.

The control board 50 may include a processor and a memory to control the operations of the liquid crystal panel 20 and the backlight unit 100. A control circuit may process image data received from an external content source, transmit image data to the liquid crystal panel 20, and transmit dimming data to the backlight unit 100.

The power board 60 may supply power to the liquid crystal panel 20 and the backlight unit 100. The liquid crystal panel 20 may block or transmit light emitted from the backlight unit 100 using the supplied power. The backlight unit 100 may emit light using the supplied power.

The control board 50 and the power board 60 may be implemented using a printed circuit board and various circuits mounted on the printed circuit board. For example, the control board 50 may include a control circuit board on which processors and memories are mounted. The power board 60 may include a power circuit board on which parts such as capacitors, coils, resistors, and processors are mounted.

Figure 4:
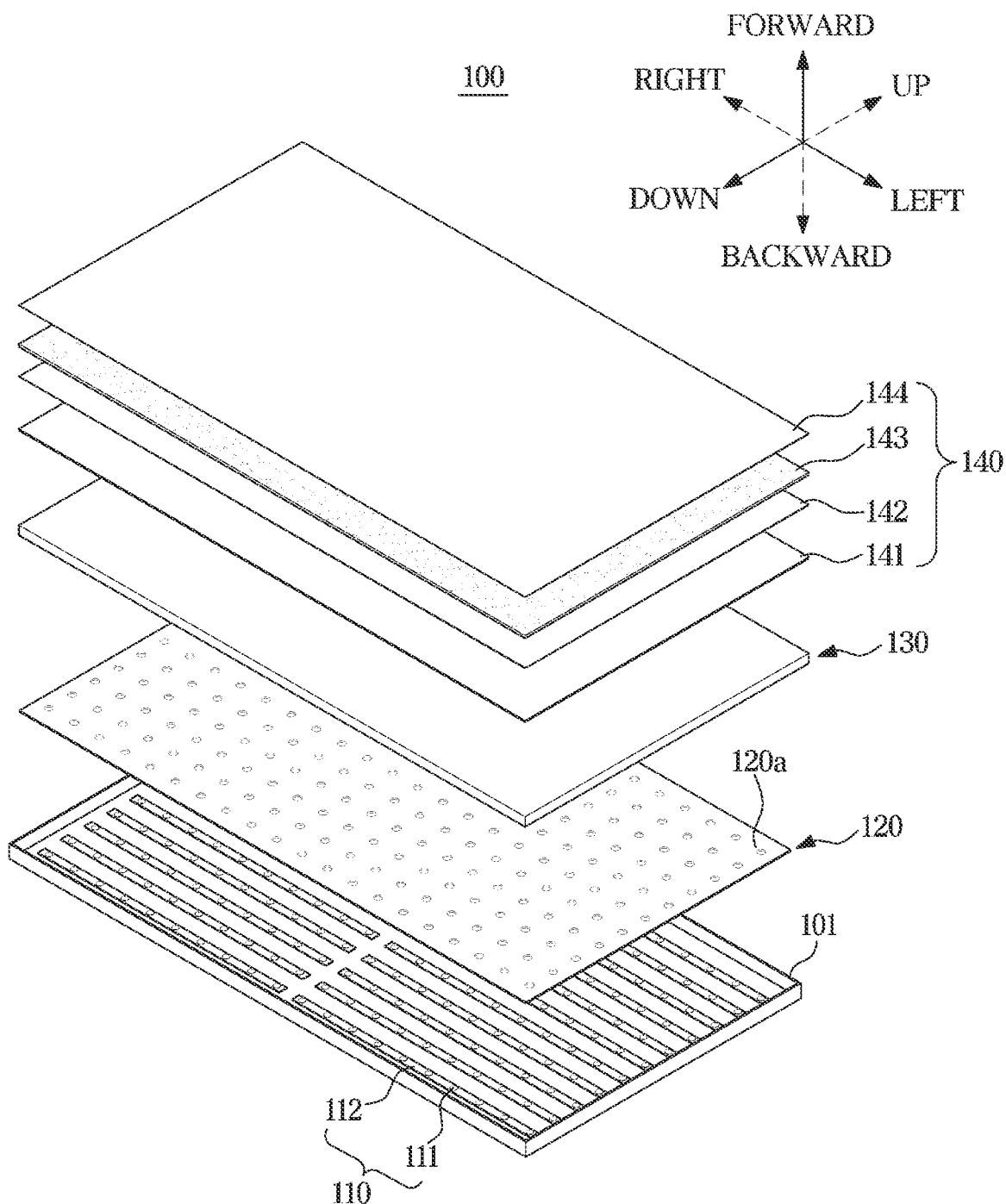
FIG. 4 is an exploded perspective view of a backlight unit included in a display apparatus according to an embodiment.
Figure 5:
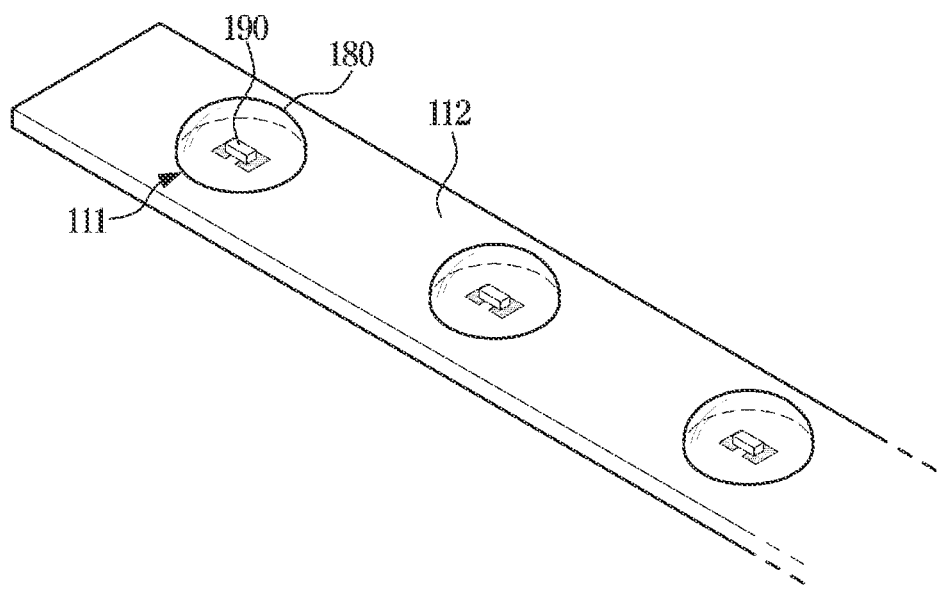
FIG. 5 is a view illustrating an example arrangement of light emitting diodes (LEDs) of an LED module according to an embodiment.
Figure 6:
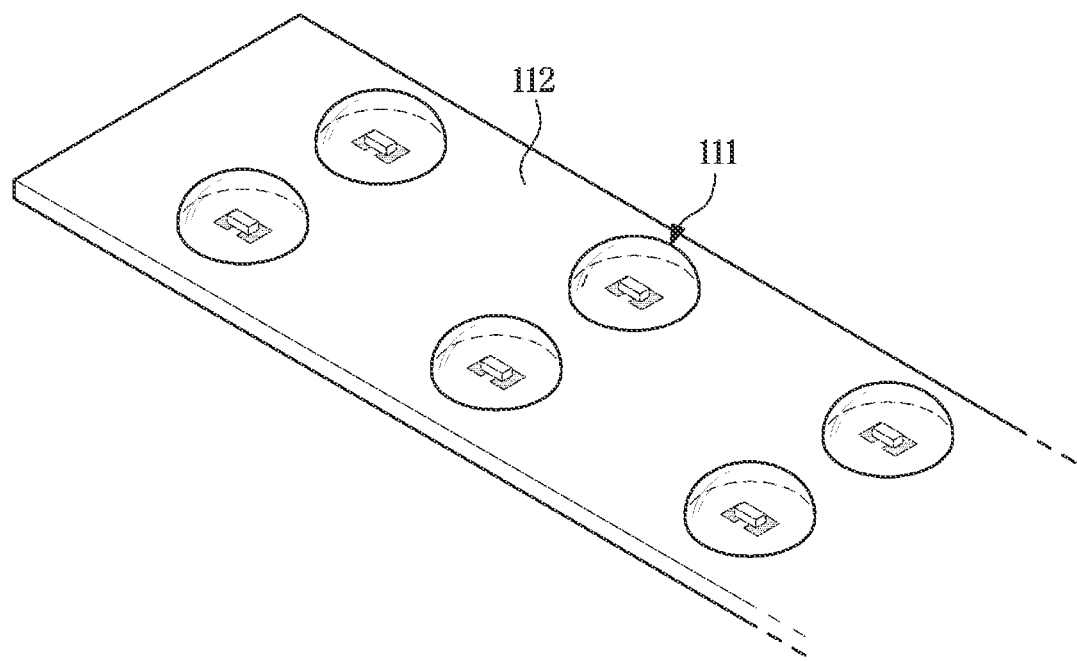
FIG. 6 is a view illustrating another example arrangement of LEDs of the LED module according to an embodiment.

FIG. 4 is an exploded perspective view of a backlight unit included in a display apparatus according to an embodiment. FIG. 5 is a view illustrating an example arrangement of light emitting diodes (LEDs) of an LED module according to an embodiment. FIG. 6 is a view illustrating another example arrangement of LEDs of an LED module according to an embodiment.

As shown in FIG. 4, the backlight unit 100 may include a plurality of light source modules 110, a reflection sheet 120, a diffuser plate 130, and an optical sheet 140 to increase luminance of the emitted light.

Each of the plurality of light source modules 110 may include a plurality of light sources 111 emitting light and a substrate 112 to support and fix the plurality of light sources 111. According to an embodiment, the plurality of light source modules 110 may be implemented as a bar-type, respectively. For example, the substrate 112 mounted with the plurality of light sources 111 may have a bar shape.

The plurality of bar-type light source modules 110 may be arranged on the front surface of the bottom chassis 101 at regular intervals. The light source modules 110 may be fixed to the bottom chassis 101 by a method of using a double-sided tape, a fastening method using screws, an assembling method to a guide provided at the bottom chassis 101, or the like.

By applying the bar-type light source modules 110 to the backlight unit 100, the number of the light sources 111 may be reduced. Therefore, a defect rate of the backlight unit 100 may be reduced, productivity thereof may be improved, and repair thereof may be facilitated. In addition, although the number of the light sources 111 decreases, high luminance and high contrast ratio may be obtained by adjusting driving currents supplied to the light sources 111.

The reflection sheet 120 may reflect light emitted from the plurality of light sources 111 forward or in a direction including a forward component.

The reflection sheet 120 may have a plurality of through-holes 120a at positions respectively corresponding to the plurality of light sources 111 of the light source module 110. The light sources 111 of the light source module 110 protrude forward from the reflection sheet 120 through the through-holes 120a and emit light in a forward direction from the reflection sheet 120. The reflection sheet 120 may reflect light, which is emitted from the plurality of light sources 111 and arrives at the reflection sheet 120, toward the diffuser plate 130.

The diffuser plate 130 may be provided in front of the light source module 110 and the reflection sheet 120. The diffuser plate 130 may uniformly diffuse light emitted from the plurality of light sources 111 of the light source module 110.

The optical sheet 140 may include various sheets to increase luminance and improve uniformity of luminance. For example, the optical sheet 140 may include a diffuser sheet 141, a first prism sheet 142, a second prism sheet 143, and a reflective polarizing sheet 144.

The diffuser sheet 141 diffuses light to improve uniformity of luminance. Light emitted from the light sources 111 may be diffused by the diffuser plate 130 and may further be diffused by the diffuser sheet 141 included in the optical sheet 140.

The first and second prism sheets 142 and 143 may increase luminance by concentrating the light diffused by the diffuser sheet 141. The first and second prism sheets 142 and 143 may have a triangular prism pattern, and a plurality of prism patterns are arranged adjacent to each other to form a plurality of bands.

The reflective polarizing sheet 144, which may be one of the polarizing films, may transmit some light beams incident thereon and reflect the other light beams to increase luminance. For example, the reflective polarizing sheet 144 may transmit light of a predetermined polarization direction and reflect light of the other directions different from the predetermined polarization direction.

Also, light reflected by the reflective polarizing sheet 144 is recycled in the backlight unit 100, and luminance of the display apparatus 10 may be increased by such recycling of light.

However, the optical sheet 140 is not limited to the structure shown in FIG. 4 and one or more of the sheets illustrated in FIG. 4 may be omitted and other sheets not shown in FIG. 4 may further be included therein.

The substrate 112 may be formed of a synthetic resin, tempered glass, or a printed circuit board (PCB) on which power supply lines for supplying power to the light sources 111 may be formed.

The plurality of light sources 111 may be mounted on the substrate 112 in accordance with predetermined alignment such that the backlight unit 100 emits light with uniform luminance. For example, the plurality of light sources 111 may be arranged such that distances between every two adjacent light sources are uniform.

Referring to FIGS. 5 and 6, the plurality of light sources 111 may be arranged linearly or in a two-dimensional matrix form and, as another example, they may also be arranged in a zigzag pattern.

The light sources 111 included in the backlight unit 100 may include light emitting diodes (LEDs). Hereinafter, a structure of the light source will be described in detail.

Figure 7:
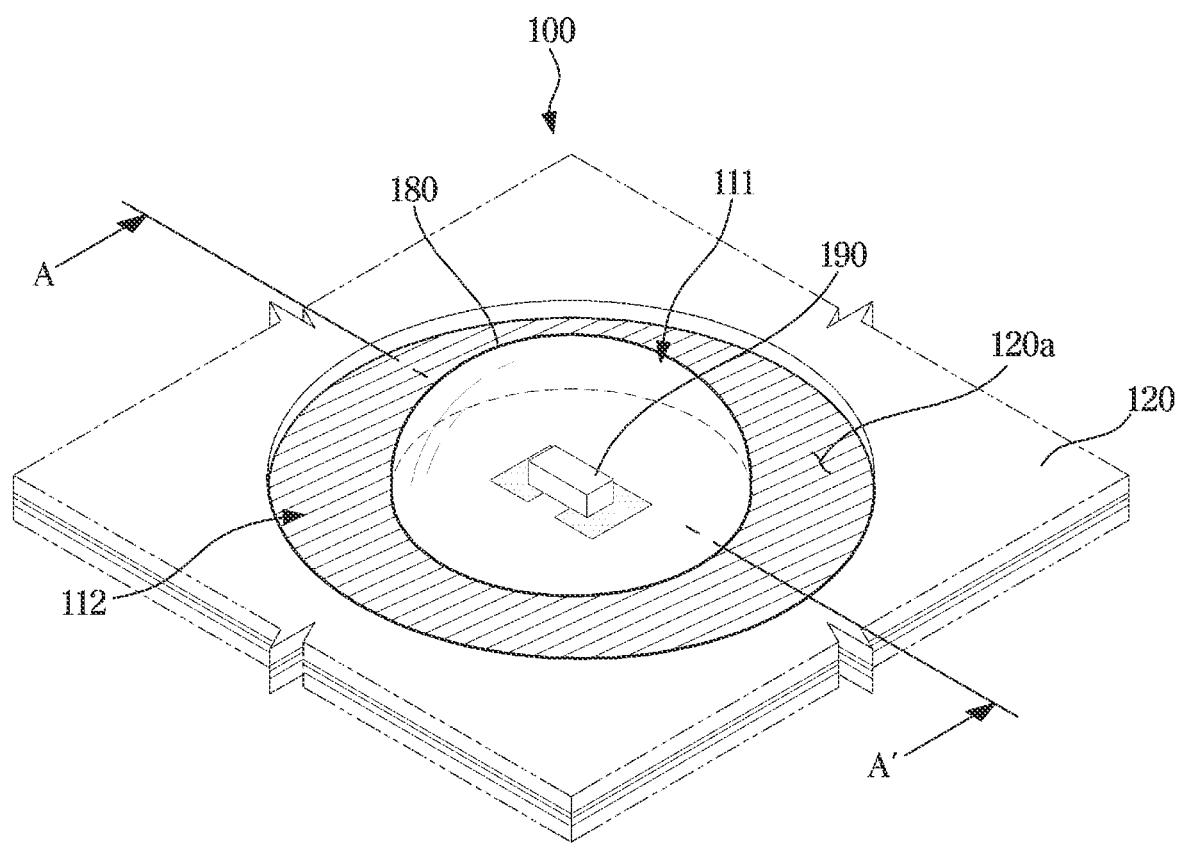
FIG. 7 is a perspective view illustrating a structure of a light source included in a light source module of a display apparatus.
Figure 8:
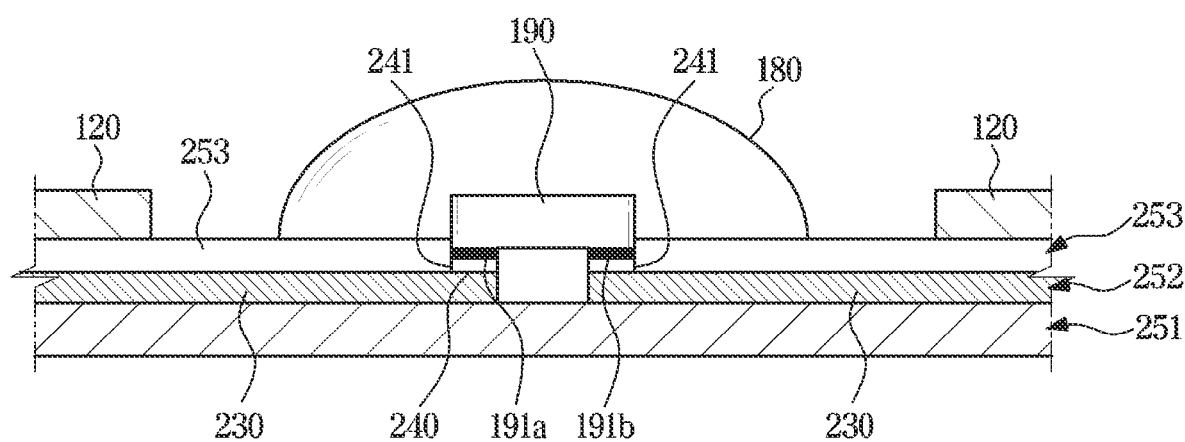
FIG. 8 is a side cross-sectional view illustrating a structure of a light source included in a light source module of a display apparatus.

FIG. 7 is a perspective view illustrating a structure of a light source included in a light source module of a display apparatus. FIG. 8 is a side cross-sectional view illustrating a structure of a light source included in a light source module of a display apparatus.

As shown in FIGS. 7 and 8, each of the plurality of light sources 111 may include a light emitting diode (LED) chip 190 and an optical dome 180. Thus, hereinafter, the light source module 110 will be referred to as LED module 110.

As described above, the plurality of light sources 111 may pass through the through-holes 120a from the rear side of the reflection sheet 120 and protrude forward from the reflection sheet 120. Therefore, as shown in FIGS. 7 and 8, the light source 111 and a part of the substrate 112 may be exposed to a space in front of the reflection sheet 120 through the through-hole 120a.

The light source 111 may include an electrical/mechanical structure located in an area defined by the through-hole 120a of the reflection sheet 120.

The LED chip 190 may be mounted on the substrate 112 in a package form and may be directly mounted on the substrate 112 as a chip on board (COB) method without a separate packaging as descried herein.

The LED chip 190 may be manufactured in a flip chip type. In the flip chip type LED, an electrode pattern may be fused to a substrate without using an intermediate medium such as a metal lead (wire) or a ball grid array (BGA). By omitting the metal lead (wire) or the BGA as described above, the size of the light source 111 may be reduced.

As illustrated in FIG. 8, the substrate 112 may be formed by alternately stacking a non-conductive insulation layer 251 and a conduction layer 252.

A line or pattern through which a power or electrical signal passes is formed on the conduction layer 252. The conduction layer 252 may be formed of various materials having electrical conductivity. For example, the conduction layer 252 may be formed of various metallic materials such as copper (Cu), tin (Sn), or aluminum (Al) or any alloy thereof.

A dielectric material of the insulation layer 251 may insulate one line or pattern of the conduction layer 252 from another line or pattern. The insulation layer 251 may be formed of a dielectric material for insulation, e.g., FR-4.

A wiring pattern 230 transferring a driving current to the LED chip 190 mounted on the substrate 112 may be implemented by a pattern formed on the conduction layer 252.

A protection layer 253 to prevent or suppress damage to the substrate 112 from external impact, chemical action (e.g., corrosion), or optical action may be formed on the uppermost layer of the substrate 112. For example, the protection layer 253 may include a photo solder resist (PSR).

The protection layer 253 may cover the wiring pattern 230 to prevent the wiring pattern 230 from being exposed to the outside.

For electrical contact between the wiring pattern 230 and the LED chip 190, the protection layer 253 may have a window to expose a part of the wiring pattern 230 to the outside. The part of the wiring pattern 230 exposed to the outside via the window formed in the protection layer 253 may constitute an electrode pad 240.

For example, the wiring pattern 230 may be partially exposed to the outside to form the electrode pad 240 electrically in contact with two electrodes 191a and 191b of the LED chip 190.

The electrode pad 240 may be electrically in contact with an anode 191a and a cathode 191b of the LED chip 190 by soldering, and power may be supplied to the LED chip 190 through the wiring pattern 230 and the electrode pad 240. Upon receiving the power, the LED chip 190 may emit light.

The optical dome 180 may be provided to cover the LED chip 190. The optical dome 180 may prevent or suppress damage to the LED chip 190 caused by external mechanical action or external chemical action. Also, the optical dome 180 may prevent the LED chip 190 from being separated from the substrate 112 by external impact.

In addition, the optical dome 180 may increase light output efficiency of the LED chip 190 by index matching. The LED chip 190 may include a transparent substrate. Light generated by the LED chip 190 is emitted through the transparent substrate. However, the light which has been emitted to a transparent substrate may not be output therefrom due to a refractive index difference between the transparent substrate and air. Thus, the optical dome 180 may allow the light emitted from the LED chip 190 to pass through the transparent substrate and the optical dome 180 to be output therefrom by decreasing the refractive index difference between the transparent substrate and air.

Also, the optical dome 180 may protect the LED chip 190 from external electrical action. For example, charges generated by electrostatic discharge cannot pass through the optical dome 180 but may flow along the outer surface of the optical dome 180.

The optical dome 180 may have, for example, a dome shape obtained by cutting a sphere or a hemispherical shape. A vertical cross-section of the optical dome 180 may have, for example, an arcuate or semicircular shape.

The optical dome 180 may be formed of a protective material capable of protecting the LED chip 190 from external stimuli. For example, the protective material may include at least one selected from the group consisting of silicone and epoxy resin.

The optical dome 180 may be optically transparent or translucent. Light emitted from the LED chip 190 may pass through the optical dome 180 to be emitted to the outside.

In this case, the dome-shaped optical dome 180, like a lens, may refract light. Light emitted from the LED chip 190 may be refracted by the optical dome 180 to disperse.

As described above, the optical dome 180 may disperse light emitted from the LED chip 190, in addition to protecting the LED chip 190 from external mechanical, chemical, or electrical action.

Figure 9:
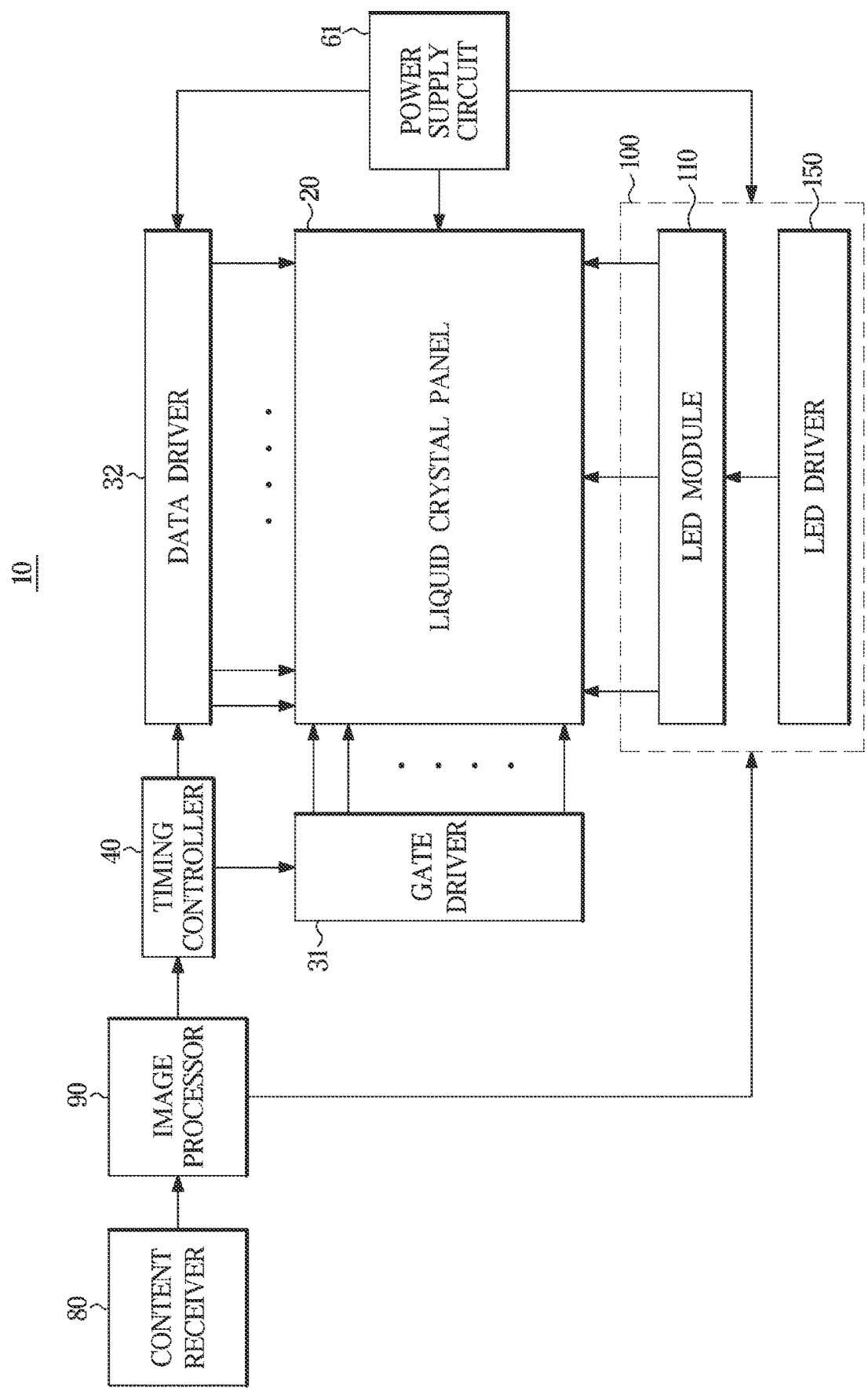
FIG. 9 is a control block diagram of a display apparatus according to an embodiment.

FIG. 9 is a control block diagram of a display apparatus according to an embodiment.

Referring to FIG. 9, a display apparatus 10 according to an embodiment may include a content receiver 80, an image processor 90, a timing controller 40, a gate driver 31, a data driver 32, a liquid crystal panel 20, a power supply circuit 61, and a backlight unit 100.

The content receiver 80 may include a receiver terminal and a tuner to receive content data including video signals and/or audio signals from content sources. The content receiver 80 may receive video signals and/or audio signals from the content sources, and output the video signals and/or audio signals received by the receiver terminal and/or the tuner to the image processor 90.

The receiver terminal may receive video and audio signals from the content sources through a cable. For example, the receiver terminal may include various types of terminals such as a component (YPbPr/RGB) terminal, a composite video blanking and sync (CVBS) terminal, an audio terminal, a high definition multimedia interface (HDMI) terminal, and a universal serial bus (USB) terminal.

The tuner may receive broadcast signals from a broadcast receiving antenna or a cable and extract a broadcast signal of a channel selected by a user among the received broadcast signals. For example, the tuner may transmit a broadcast signal having a frequency corresponding to the channel selected by the user and may block broadcast signals having the other frequencies among the plurality of broadcast signals received through the broadcast receiving antenna or a cable.

The content data received by the content receiver 80 may be processed in the image processor 90 to be converted into a form that may be output to the liquid crystal panel 20.

The image processor 90 may include at least one memory to store programs used to perform operations, which will be described below, and at least one processor configured to execute the programs stored in the memory.

The image processor 90 may process the content data input via the content receiver 80 to generate image data corresponding to the input content data.

For example, the image processor 90 may include a source decoder, a scaler, an image enhancer, and a graphic processor. The source decoder may decode the content data compressed in a format such as MPEG, and the scaler may output image data of a desired resolution by resolution conversion.

The image enhancer may enhance the quality of an image by applying various correction techniques. The graphic processor may classify pixels of image data into RGB data and output the same together with a control signal such as a syncing signal for display timing in the liquid crystal panel 20. For example, the image processor 90 may output image data corresponding to the content data and a control signal.

The above-described operations of the image processor 90 are merely examples applicable to the display apparatus 10, and it is possible to further perform another operation or omit some of the above-described operations.

The image data and the control signal output from the image processor 90 may be transmitted to the timing controller 40.

The timing controller 40 may convert the image data received from the image processor 90 into a form that can be processed in the panel driver 30 and generate various control signals such as a timing control signal required to display image data on the liquid crystal panel 20.

The image processor 90 and the timing controller 40 may be mounted on the above-described control board 50. According to an embodiment, the timing controller 40 and the image processor 90 may be integrally formed.

The panel driver 30 may generate a driving signal to control the liquid crystal panel 20 to display an image based on the image data and the timing control signal received from the timing controller 40.

The driving signal generated by the panel driver 30 may include a gate signal and a data signal. The panel driver 30 may include the gate driver 31 configured to generate the gate signal and the data driver 32 configured to generate the data signal.

The power supply circuit 61 may supply power over the display apparatus 10. For example, the power supply circuit 61 may supply power to the panel driver 30, the liquid crystal panel 20, the backlight unit 100, and the like.

The power supply circuit 61 may include a DC-DC converter to convert voltage levels of direct current, an inductor to remove harmonic waves, or the like, and a capacitor to store DC voltage.

For example, the power supply circuit 61 may be implemented as a switching mode power supply (SMPS) circuit and mounted on the above-described power board 60.

The LED module 110 of the backlight unit 100 may receive driving power from the power supply circuit 61. In this regard, a driving current supplied to the LED chip 190 may be adjusted by an LED driver 150.

The LED driver 150 may be mounted on the substrate 112 together with the LED chip 190 or may be mounted on any region other than the substrate 112.

In addition, the driving current of one LED module 110 may be controlled by one LED driver 150 or by a plurality of LED drivers 150.

In addition, one LED driver 150 may control the driving current supplied to one LED module 110 or control the driving current supplied to a plurality of LED modules 110.

Figure 10:
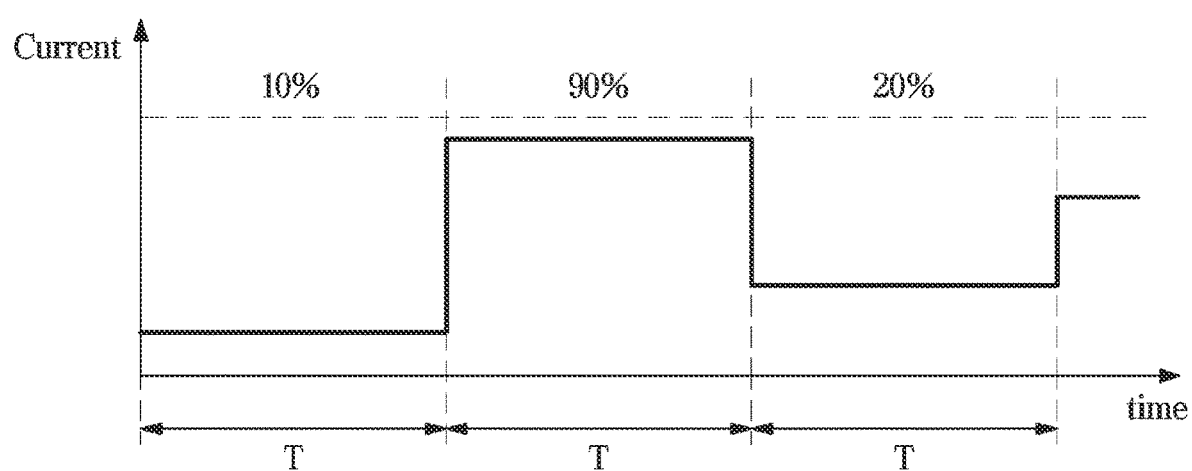
FIG. 10 is a view illustrating a driving current pattern in the case of controlling luminance of an LED by pulse amplitude modulation (PAM)
Figure 11:
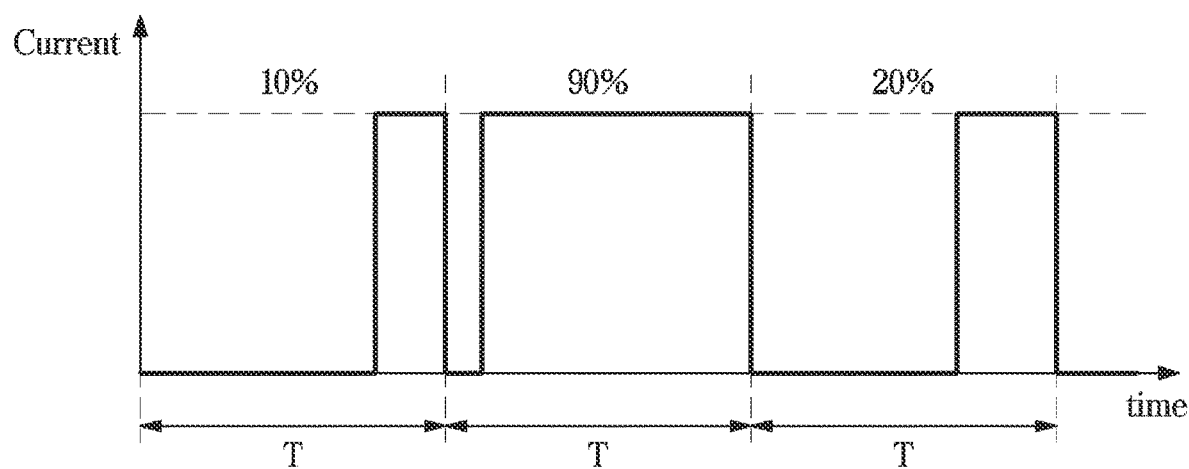
FIG. 11 is a view illustrating a driving current pattern in the case of controlling luminance of an LED by pulse width modulation (PWM)

FIG. 10 is a view illustrating a driving current pattern in the case of controlling luminance of an LED by pulse amplitude modulation (PAM). FIG. 11 is a view illustrating a driving current pattern in the case of controlling luminance of an LED by pulse width modulation (PWM).

In the case of PAM control, as shown in FIG. 10, luminance of an LED is adjusted by changing the amplitude at regular intervals T while constantly maintaining the pulse width.

In the case of PWM control, as shown in FIG. 11, luminance of an LED is controlled by changing the pulse width at regular intervals T while constantly maintaining the amplitude.

The display apparatus 10 according to an embodiment may control luminance of the LED chip 190 by PWM control. Alternatively, both the PWM control and the PAM control may be applied together.

In the latter case, the control method may be changed in accordance with a mode of the display apparatus 10. For example, the PAM control and the PWM control may be selectively applied to the display apparatus 10 in accordance with the mode of display apparatus 10, e.g., a TV mode, a movie mode, and a game mode.

The LED driver 150 may include a PWM control circuit or both the PWM control circuit and a PAM control circuit.

Figure 12:
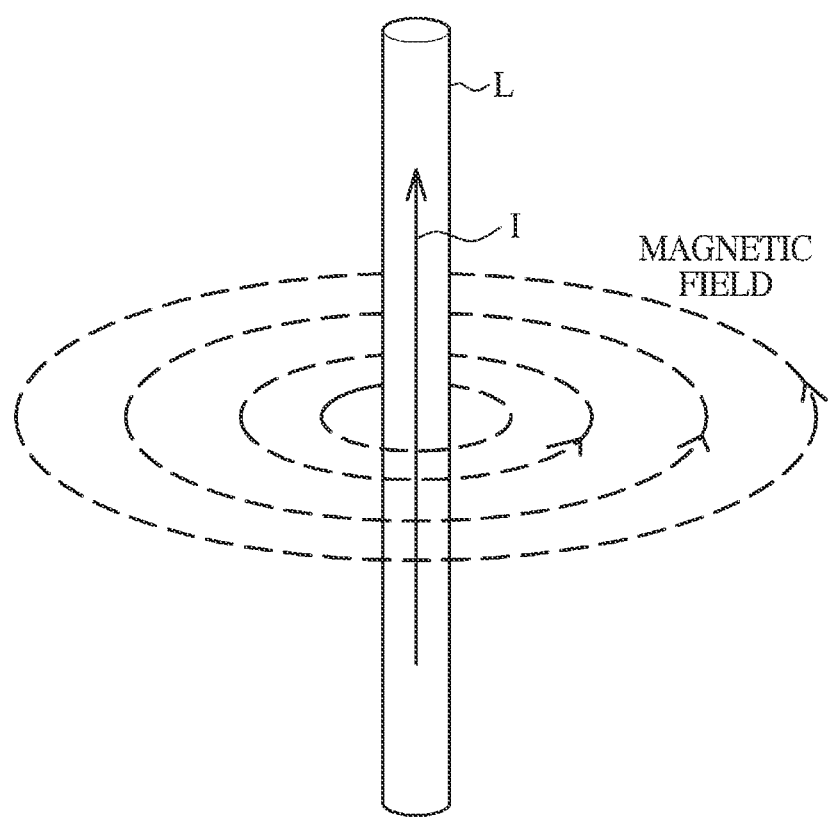
FIG. 12 is a view illustrating a magnetic field formed by a current flowing in a conducting wire.
Figure 13:
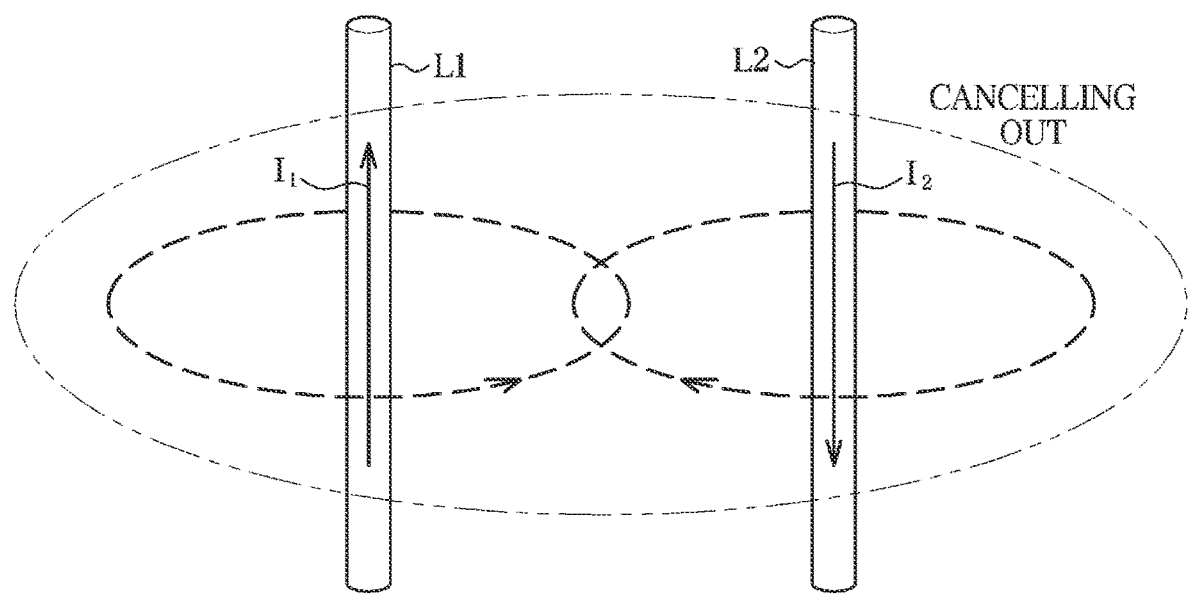
FIG. 13 is a view illustrating an effect of currents flowing in opposite directions on cancelling out a magnetic field.

FIG. 12 is a view illustrating a magnetic field formed by a current flowing in a conducting wire. FIG. 13 is a view illustrating an effect of currents flowing in opposite directions on cancelling out a magnetic field.

According to Ampere's law, a magnetic field is formed around a conducting wire L by a current I flowing in the conducting wire L, and a direction of the formed magnetic field is as shown in FIG. 12.

As described above, the display apparatus 10 according to an embodiment may adjust luminance of the LED chip 190 of the backlight unit 100 by PWM control. By the PWM control, a supply of a driving current to the LED chip 190 and an interruption to the supply are repeated, and thus generation and extinction of a magnetic field repeatedly occur to cause vibration (acoustic noise) between the LED module and the bottom chassis supporting the same. Particularly, in the case where the LED module is assembled to a guide provided at the bottom chassis, the acoustic noise may be increased.

The LED module 110 and the display apparatus 10 including the same according to an embodiment may have a wiring pattern 230 capable of minimizing generation of the acoustic noise.

According to Ampere's law, directions of magnetic fields generated around two parallel conducting wires L1 and L2 in which currents I1 and I2 flow in opposite directions are as shown in FIG. 13.

The magnetic fields created in opposite directions cancel each other out by interacting with each other to disappear. In the case where currents flow in opposite directions, a magnetic field created at each of the two conducting wires L1 and L2 is canceled out, and the overall magnetic field created around the two conducting wires L1 and L2 decreases.

Therefore, in the LED module 110 and the display apparatus 10 including the same according to an embodiment, the wiring pattern 230 transferring the driving current to the LED chip 190 may be implemented to have a shape bent multiple times to allow adjacent driving currents to flow in opposite directions.

By flowing the driving currents in opposite directions, the magnetic fields may be canceled out so that the above-described acoustic noise caused by vibration between the LED module and the bottom chassis may be reduced.

Hereinafter, the shape of the wiring pattern 230 applicable to an embodiment will be described in detail.

Figure 14:
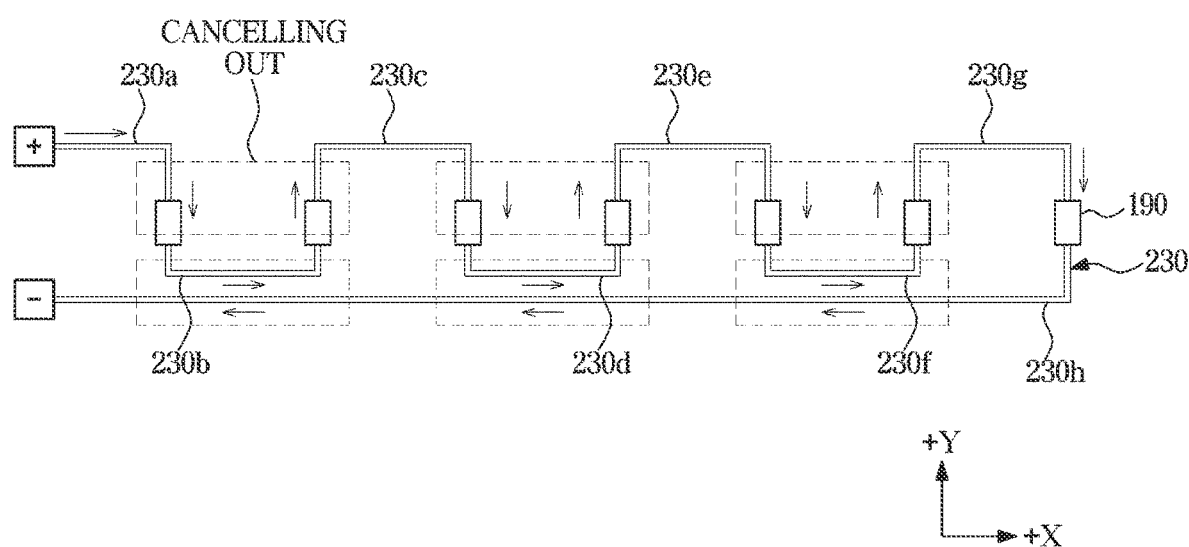
FIG. 14 is a view illustrating an example of a wiring pattern applicable to an LED module according to an embodiment.
Figure 15:
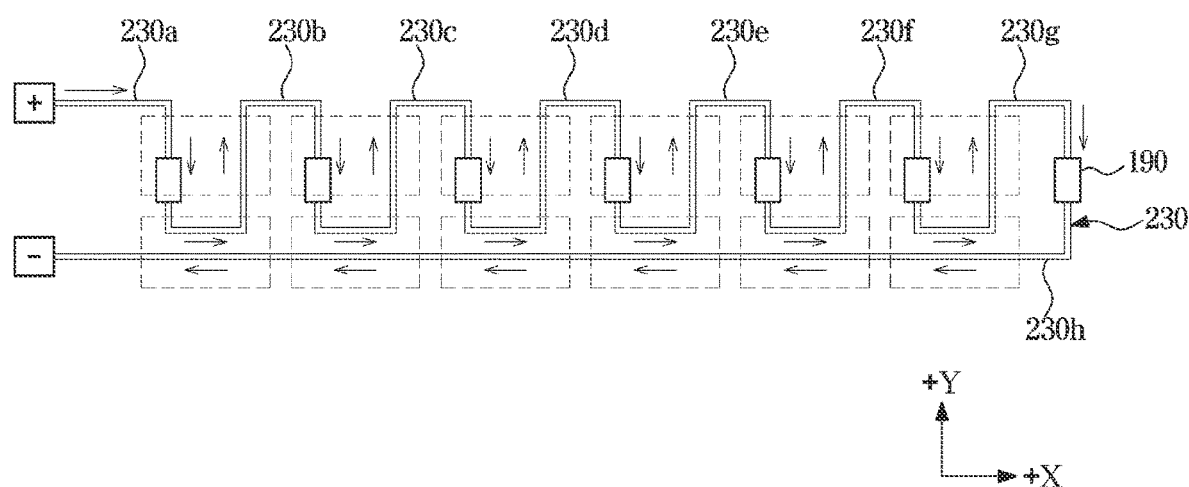
FIG. 15 is a view illustrating another example of a wiring pattern applicable to an LED module according to an embodiment.
Figure 16:
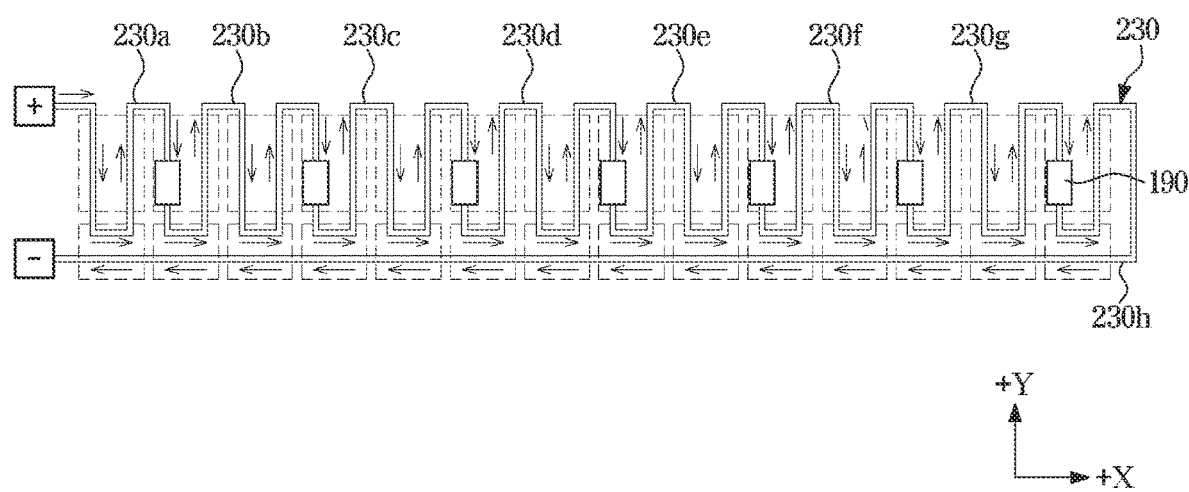
FIG. 16 is a view illustrating another example of a wiring pattern applicable to an LED module according to an embodiment.

FIG. 14 is a view illustrating an example of a wiring pattern applicable to an LED module according to an embodiment. FIG. 15 is a view illustrating another example of a wiring pattern applicable to an LED module according to an embodiment. FIG. 16 is a view illustrating another example of a wiring pattern applicable to an LED module according to an embodiment. These examples are given to describe a case in which both ends of the wiring pattern 230 are located at the same side (left side).

One end of the wiring pattern 230 is connected to an anode terminal, and the other end of the wiring pattern 230 is connected to a cathode terminal. For example, in an embodiment, the wiring pattern 230 having one end to which a driving voltage is applied and the other end to which a reference voltage (ground voltage) is applied may be defined as one unit. The wiring pattern 230, even when it is not continuously connected from one end to the other end as one conductor, may be defined as one wiring pattern 230.

For example, as shown in FIGS. 14 to 16, the wiring pattern 230 may include a plurality of connection wires 230a, 230b, 230c, 230d, 230e, 230f, 230g, and 230h to connect the plurality of LED chips 190 in series.

Although one wiring pattern 230 connecting 7 LED chips 190 is exemplarily described in the present embodiment, the number of the LED chips 190 connected by the wiring pattern 230 is not particularly limited.

Among the plurality of connection wires, one end of each of the connection wires 230b, 230c, 230d, 230e, 230f, and 230g respectively connecting two adjacent LED chips 190, may be electrically connected to a cathode of one of two adjacent LED chips 190 and the other end may be electrically connected to an anode of the other LED chip 190.

Referring to FIGS. 14 and 15, the plurality of connection wires 230a, 230b, 230c, 230d, 230e, 230f, 230g, and 230h may have a shape bent multiple times. The wiring pattern 230 may have a zigzag shape due to the bending of the plurality of connection wires.

According to the example shown in FIG. 14, among the plurality of connection wires, each of the connection wires 230b, 230c, 230d, 230e, 230f, and 230g respectively connecting two adjacent LED chips 190 may be bent twice by 90°. By bending twice, the connection wires may have a "U" shape, and thus directions of driving currents flowing parallel to each other in the up and down directions (y-axis direction) may be opposite to each other.

In addition, a direction of a driving current flowing to the right (+x direction) in the connection wires 230b, 230c, 230d, 230e, 230f, and 230g respectively connecting two adjacent LED chips 190 may be opposite to a direction of a driving current flowing to the left (-x direction) in the connection wire 230h connected to the ground voltage. In this case, the effect on canceling out the magnetic field may be obtained.

Alternatively, as shown in FIG. 15, each of the connection wires 230b, 230c, 230d, 230e, 230f, and 230g respectively connecting two adjacent LED chips 190 may be bent four times by 90°, or may be bent eight times by 90° as shown in FIG. 16.

Figure 17:
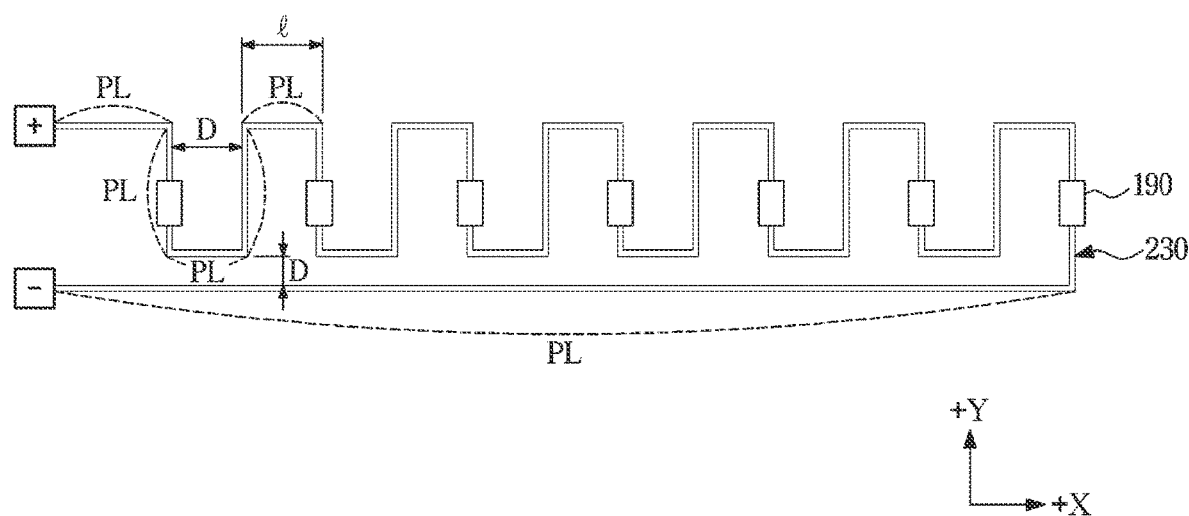
FIG. 17 is a view illustrating another example of a wiring pattern in an LED module according to an embodiment.

FIG. 17 is a view illustrating another definition of a wiring pattern in an LED module according to an embodiment.

Referring to FIG. 17, one wiring pattern 230 may include a plurality of partial lines PL, and each of the partial lines PL may be defined to have a linear shape. The plurality of partial lines PL may be distinguished from one another by bending. For example, by bending once, two partial lines PL may be generated.

In addition, one connection wire may include a plurality of partial lines PL by bending at least once. In the case where two connection wires are connected to one LED chip 190, one partial line PL may include parts of the plurality of connection wires.

Among the plurality of partial lines PL, in adjacent partial lines PL parallel to each other, currents flow in opposite directions, and thus the magnetic field-canceling effect may be obtained.

To maximize the magnetic field-canceling effect, the wiring pattern 230 may be formed such that a distance D between a pair of adjacent partial lines PL parallel to each other is less than a first reference value. In this regard, the first reference value may be determined in consideration of the magnetic field-canceling effect, the size and number of the LED chips 190, etc.

Meanwhile, in the case of a partial line PL unable to obtain the magnetic field-canceling effect, the intensity of the magnetic field may be reduced by controlling the length of the partial line PL. For example, the wiring pattern 230 may be formed such that, among a pair of partial lines PL whose magnetic fields are canceled out and a partial line PL perpendicular thereto, the partial line PL whose magnetic field is not canceled out may be designed to have a length 1 less than a second reference value. In this regard, the second reference value may be determined in consideration of the distance between the adjacent partial lines PL parallel to each other, the magnetic field-canceling effect obtained thereby, the intensity of the magnetic field according to the length of the partial line PL, etc.

Figure 18:
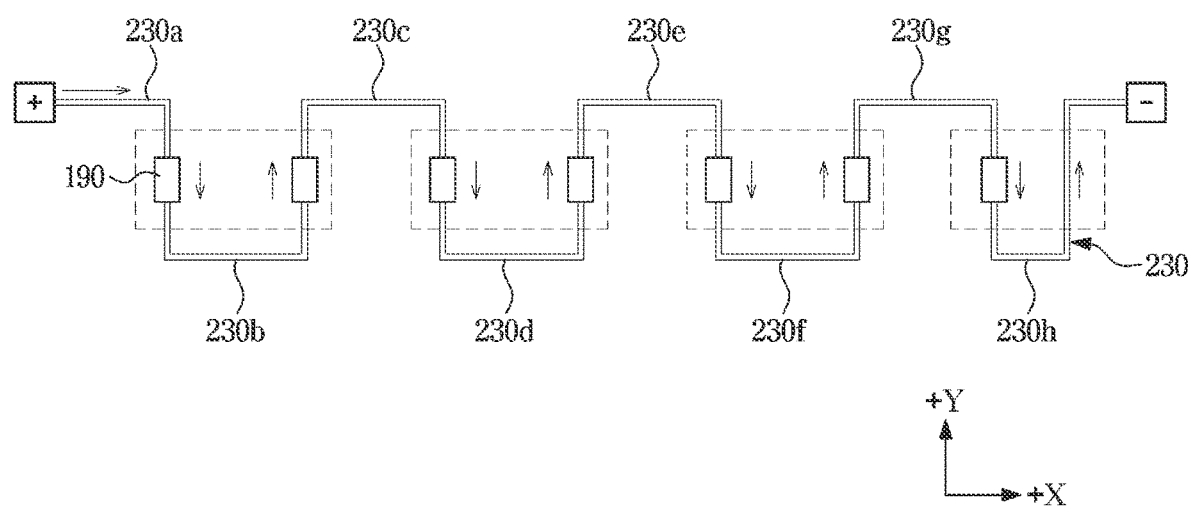
FIG. 18 is a view illustrating an example of a wiring pattern applicable to an LED module according to an embodiment.
Figure 19:
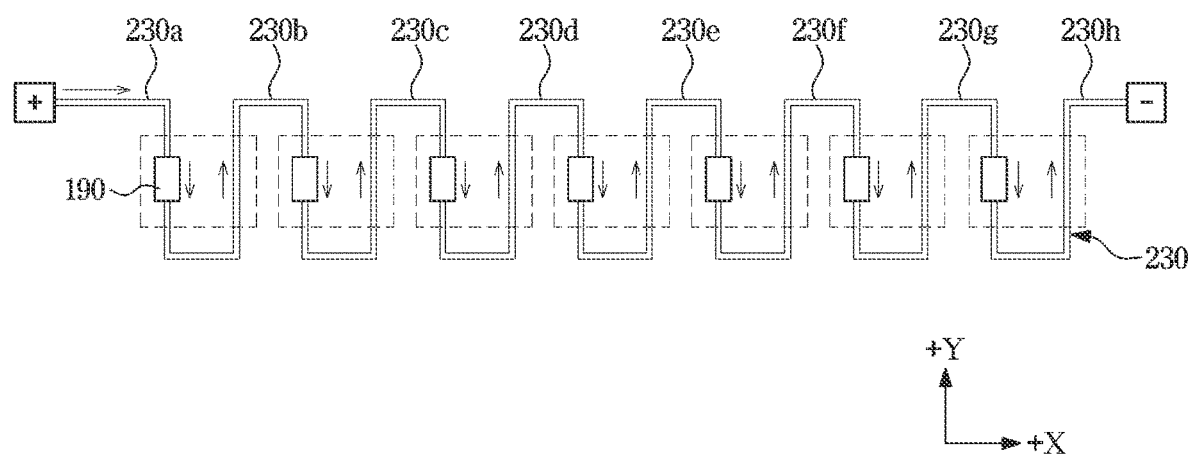
FIG. 19 is a view illustrating another example of a wiring pattern applicable to an LED module according to an embodiment.
Figure 20:
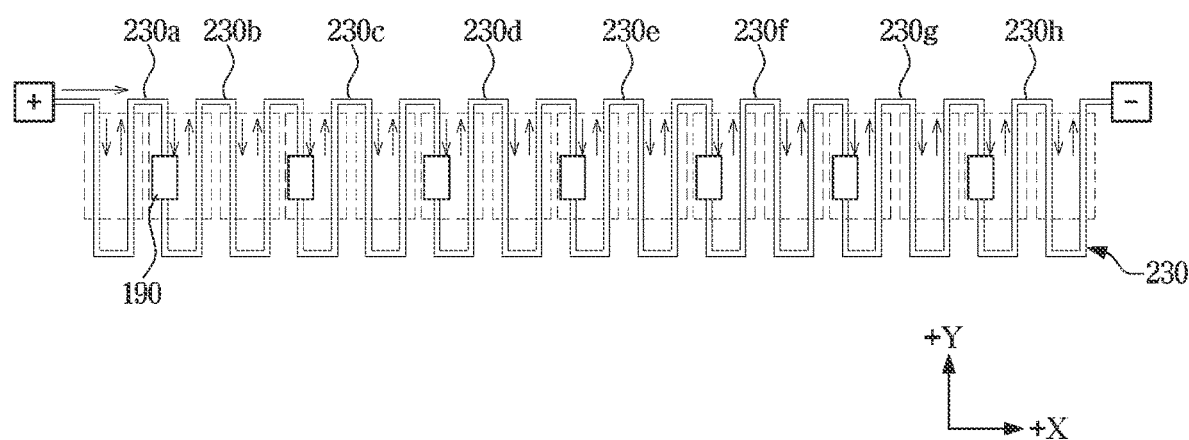
FIG. 20 is a view illustrating another example of a wiring pattern applicable to an LED module according to an embodiment.

FIG. 18 is a view illustrating an example of a wiring pattern applicable to an LED module according to an embodiment. FIG. 19 is a view illustrating another example of a wiring pattern applicable to an LED module according to an embodiment. FIG. 20 is a view illustrating another example of a wiring pattern applicable to an LED module according to an embodiment. These examples are given to describe a case in which both ends of the wiring pattern 230 are located at the opposite sides (left and right sides).

Referring to FIG. 18, as described in the example shown in FIG. 14, among the plurality of connection wires, the connection wires 230b, 230c, 230d, 230e, 230f, and 230g respectively connecting two adjacent LED chips 190 may be bent twice by 90°. By bending one connection wire twice by 90°, a pair of partial lines PL in which currents flow in opposite directions may be formed.

In addition, as illustrated in FIG. 19, the connection wires 230b, 230c, 230d, 230e, 230f, and 230g respectively connecting two adjacent LED chips 190 may be bent four times by 90°. By bending two connection wires four times by 90°, two pairs of partial lines in which currents flow in opposite directions may be formed.

In addition, as illustrated in FIG. 20, the connection wires 230b, 230c, 230d, 230e, 230f, and 230g respectively connecting two adjacent LED chips 190 may be bent eight times by 90°. By bending one connection wire eight times by 90°, two pairs of partial lines in which currents flow in opposite directions may be formed.

Figure 21:
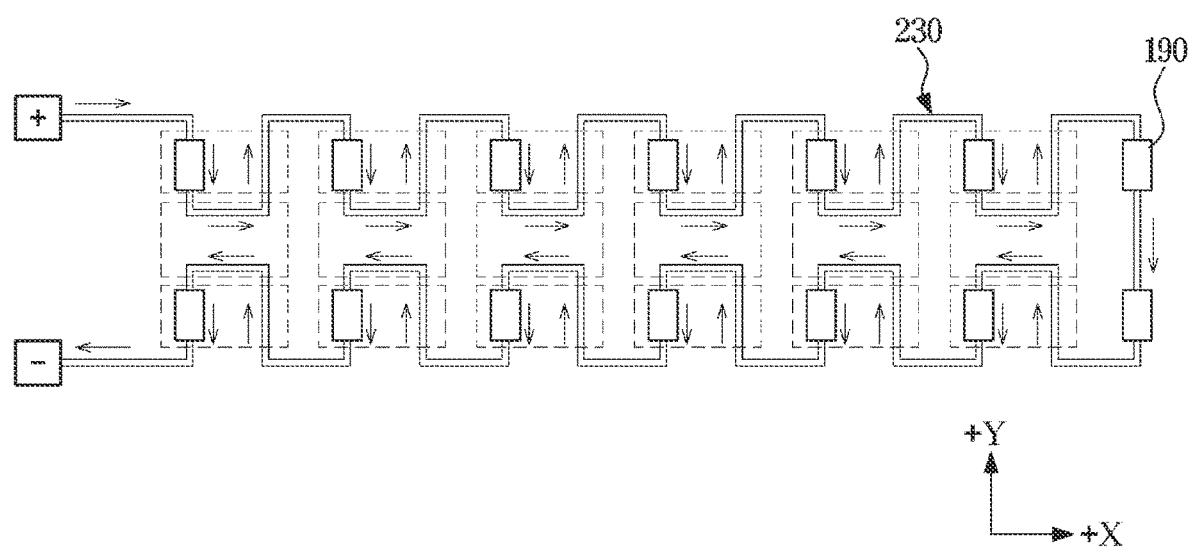
FIG. 21 is a view illustrating a wiring pattern applicable to a case in which LEDs connected in series are arranged two-dimensionally in an LED module according to an embodiment.

FIG. 21 is a view illustrating a wiring pattern applicable to a case in which LEDs connected in series are arranged two-dimensionally in an LED module according to an embodiment.

Referring to FIG. 21, in the case where the LED chips 190 are two-dimensionally arranged, the wiring pattern 230 may be formed by bending connection wires connecting the plurality of LED chips 190 at least twice as described above.

In this example, some of the partial lines PL aligned in the x-axis direction and connecting the LED chips 190 aligned in a first row may be arranged adjacent and parallel to some of the partial lines PL aligned in the x-axis direction and connecting the LED chips 190 aligned in a second row. Because the directions of driving currents flowing therein are opposite to each other, the magnetic field-canceling effect may be obtained.

The shapes of the wiring pattern 230 described above with reference to FIGS. 14 to 21 are merely examples applicable to the embodiment of the LED module 110. Although the above-described examples are cases in which the plurality of LED chips 190 are connected in series, the magnetic field may be canceled out by bending the wiring pattern 230 multiple times even when the plurality of LED chips 190 are connected in parallel.

However, the examples of the LED module 110 are not limited to the shapes of the wiring patterns 230 described above, and any structure in which driving currents adjacent and parallel to each other flow in opposite directions by bending the wiring pattern 230 multiple times may be included in the examples of the LED module 110.

In addition, among the descriptions for each example, some repeated descriptions are omitted. Therefore, descriptions of one example applicable to another example may be equally applied to the other examples although they are not repeatedly given.

The embodiments of the present disclosure have been shown and described above with reference to the accompanying drawings. It will be understood by those of ordinary skill in the art that the present disclosure may be easily modified into other detailed forms without changing the technical principle or essential features of the present disclosure. However, the disclosed embodiments are illustrative and the scope of the present disclosure is not limited thereby.

What is claimed is:

1. A light emitting diode (LED) module comprising:
   a substrate having a bar shape and extending in a first direction;
   a plurality of LEDs provided on the substrate and connected in series; and
   a wiring pattern provided on the substrate and configured to transmit driving currents to the plurality of LEDs, the wiring pattern comprising a plurality of partial lines that are connected in series between an anode terminal and a cathode terminal,
   wherein the plurality of partial lines comprises:
      a plurality of first partial lines extending in a second direction and aligned adjacent and parallel to each other in the first direction, the second direction being perpendicular to the first direction;
      a plurality of second partial lines extending in the first direction and aligned adjacent and parallel to each other; and
      a linear partial line extending in the first direction and connecting a last LED in a direction where a driving current flows among the plurality of LEDs and the cathode terminal,
   wherein the wiring pattern has a shape that is bent multiple times such that the driving currents flow in opposite directions in any two immediately adjacent first partial lines among the plurality of first partial lines,
   wherein the driving currents flow in opposite directions in the linear partial line and a second partial line, which is adjacent to the linear partial line, among the plurality of second partial lines,
   wherein a second partial line, which is positioned away from the linear partial line, among the plurality of second partial lines has a length that is less than a reference value, and
   wherein the reference value is determined based on a distance between two immediately adjacent first partial lines.

2. The LED module according to claim 1, wherein the plurality of LEDs are connected in series by the wiring pattern, and
   the wiring pattern comprises a plurality of connection wires respectively connecting two adjacent LEDs among the plurality of LEDs connected in series.

3. The LED module according to claim 2, wherein each of the plurality of connection wires has a shape that is bent at least twice.

4. The LED module according to claim 2, wherein each of the plurality of connection wires has a shape that is bent 90° at least twice.

5. The LED module according to claim 1, wherein the plurality of first partial lines and the plurality of second partial lines are defined by the bending and have a linear shape.

6. The LED module according to claim 1, wherein a first end of the wiring pattern is connected to the anode terminal to which a driving voltage is applied and a second end of the wiring pattern is connected to the cathode terminal to which a ground voltage is applied, and the first and second ends of the wiring pattern are located at a same side of the wiring pattern.

7. A display apparatus comprising:
   a bottom chassis;
   a plurality of light emitting diode (LED) modules provided on the bottom chassis;
   a liquid crystal panel provided in front of the plurality of LED modules; and
   an LED driver configured to control driving currents supplied to the plurality of LED modules,
   wherein each of the plurality of LED modules comprises:
      a substrate having a bar shape and extending in a first direction;
      a plurality of LEDs provided on the substrate and connected in series; and
      a wiring pattern provided on the substrate and configured to transmit the driving currents to the plurality of LEDs, the wiring pattern comprising a plurality of partial lines that are connected in series between an anode terminal and a cathode terminal, wherein the plurality of partial lines comprises:
         a plurality of first partial lines extending in a second direction and aligned adjacent and parallel to each other in the first direction, the second direction being perpendicular to the first direction;
         a plurality of second partial lines extending in the first direction and aligned adjacent and parallel to each other; and
         a linear partial line extending in the first direction and connecting a last LED in a direction where a driving current flows among the plurality of LEDs and the cathode terminal,
      wherein the wiring pattern has a shape that is bent multiple times such that the driving currents flow in opposite directions in any two immediately adjacent first partial lines among the plurality of first partial lines,
      wherein the driving currents flow in opposite directions in the linear partial line and a second partial line, which is adjacent to the linear partial line, among the plurality of second partial lines,
      wherein a second partial line, positioned away from the linear partial line, among the plurality of second partial lines, has a length that is less than a reference value, and
      wherein the reference value is determined based on a distance between two immediately adjacent first partial lines.

8. The display apparatus according to claim 7, wherein the plurality of LEDs are connected in series by the wiring pattern, and
   the wiring pattern comprises a plurality of connection wires respectively connecting two adjacent LEDs among the plurality of LEDs connected in series.

9. The display apparatus according to claim 8, wherein each of the plurality of connection wires has a shape that is bent at least twice.

10. The display apparatus according to claim 8, wherein each of the plurality of connection wires has a shape that is bent 90° at least twice.

11. The display apparatus according to claim 7, wherein the plurality of partial lines are defined by the bending and have a linear shape.

12. A wiring pattern formed on a substrate to transmit a driving current to a plurality of light sources connected in series, the wiring pattern comprising:
   a connection wire connecting a first light source and a second light source among the plurality of light sources, wherein the connection wire has at least a first bend to change an orientation of the driving current from a first direction to a second direction, and a second bend to change the orientation of the driving current from the second direction to a third direction, the connection wire comprising a plurality of partial lines that are connected in series between an anode terminal and a cathode terminal,
   wherein the substrate extends in the first direction,
   wherein the plurality of partial lines comprises:
      a plurality of first partial lines extending in the second direction and aligned adjacent and parallel to each other in the first direction, the second direction being perpendicular to the first direction;
      a plurality of second partial lines extending in the first direction and aligned adjacent and parallel to each other; and
      a linear partial line extending in the first direction and connecting a last light source in a direction where a driving current flows among the plurality of light sources and the cathode terminal,
   wherein the wiring pattern has a shape that is bent multiple times such that the driving currents flow in opposite directions in any two immediately adjacent first partial lines among the plurality of first partial lines,
   wherein the driving currents flow in opposite directions in the linear partial line and a second partial line, which is adjacent to the linear partial line, among the plurality of second partial lines,
   wherein a second partial line, positioned away from the linear partial line, among the plurality of second partial lines, has a length that is less than a reference value, and
   wherein the reference value is determined based on a distance between two immediately adjacent first partial lines.

13. The wiring pattern according to claim 12, wherein the first direction and the third direction are opposite to each other.

14. The wiring pattern according to claim 12, wherein the plurality of connection wires connect the plurality of light sources in series from the first light source to the last light source, and the wiring pattern further comprises:
   an anode connection wire connecting the anode terminal at a first end of the wiring pattern to an anode of the first light source; and
   a cathode connection wire connecting a cathode of the last light source to the cathode terminal at a second end of the wiring pattern, and
   wherein the anode terminal and the cathode terminal are on a same side of the wiring pattern.

15. The wiring pattern according to claim 12, wherein the plurality of connection wires connect the plurality of light sources in series from the first light source to the last light source, and the wiring pattern further comprises:
   an anode connection wire connecting the anode terminal at a first end of the wiring pattern to an anode of the first light source; and
   a cathode connection wire connecting a cathode of the last light source to the cathode terminal at a second end of the wiring pattern, and wherein the anode terminal and the cathode terminal are on opposite sides of the wiring pattern.

\* \* \* \* \*